United States Patent [19]

Young

[11] Patent Number: 4,810,950
[45] Date of Patent: Mar. 7, 1989

[54] LOAD RESISTANCE MEASURING TECHNIQUE

[75] Inventor: Thomas A. Young, Oak Hill, W. Va.

[73] Assignee: OB Products, Inc., Mansfield, Ohio

[21] Appl. No.: 886,350

[22] Filed: Jul. 17, 1986

[51] Int. Cl.[4] .......................................... G01R 27/00
[52] U.S. Cl. ............................. 324/57 PS; 324/57 Q
[58] Field of Search ............... 324/57 PS, 57 Q, 57 R, 324/62, 64

[56] References Cited

U.S. PATENT DOCUMENTS

| | | | |
|---|---|---|---|
| 1,953,108 | 4/1934 | Harder | 175/294 |
| 2,687,497 | 8/1954 | Schurr | 317/23 |
| 3,163,818 | 12/1964 | Spaven | 324/57 Q |
| 3,609,459 | 9/1971 | Thompson | 317/23 |
| 3,676,739 | 7/1972 | Neuhouser | 317/18 |
| 4,164,773 | 8/1979 | DeLacy | 361/69 |
| 4,232,232 | 11/1980 | DeLacy et al. | 307/139 |
| 4,454,555 | 6/1984 | DeLacy | 361/59 |
| 4,458,196 | 7/1984 | Goyal | 324/57 PS |
| 4,482,858 | 11/1984 | Plichta | 324/57 PS |

OTHER PUBLICATIONS

H. H. Skilling, "Electrical Engineering Circuits", Chapter 3, Section 15, pp. 84-86.

*Primary Examiner*—Gerard R. Strecker
*Assistant Examiner*—Jose M. Solis
*Attorney, Agent, or Firm*—Walter G. Marple, Jr.; John E. Kidd; Nicholas L. Coch

[57] ABSTRACT

The resistance of an inductive load is measured by connecting an inductor to the load and applying a pulse of energy to the load and the inductor. The voltage across the inductor is monitored and the load voltage and current are measured when the inductor voltage passes through zero. The ratio of the voltage and current at the instant of zero crossing is equal to the load resistance value. An apparatus for performing this method is disclosed.

5 Claims, 2 Drawing Sheets

LOAD RESISTANCE MEASURING TECHNIQUE

This invention relates to a technique for measuring the resistance of a load circuit which has an inductive complex impedance and particularly one in which the resistive and reactive elements are distributed and thus cannot be isolated, or in which the inductance is very large.

BACKGROUND OF THE INVENTION

Measuring the impedance in a large system in which conductive components of various kinds contribute to the resistive as well as reactive components can present a substantial practical problem. A prime example of such a system is an electrical transit system which is energized by direct current. It is important to know the resistance of the system in, for example, a circuit breaker recloser. If a circuit breaker has opened as the result of an overload, it is desirable to close the breaker again as soon as possible but only if the condition of the circuit meets certain requirements. These requirements can be defined in various ways but the fundamental condition which must be met is the absence of a severe fault in the system which would cause an extreme current surge as soon as the breaker is reclosed with resulting damage or immediate reopening of the breaker. The existence of a fault of this type can indicate a dangerous condition along the line.

Devices for evaluating the condition of a system in the context of automatic reclosers are shown in the following patents:

U.S. Pat. No. 4,454,555, DeLacy
U.S. Pat. No. 4,232,232, DeLacy et al
U.S. Pat. No. 4,164,773, DeLacy These patents involve rather complex and quite expensive devices. Furthermore, the measurements and evaluations which are made are not necessarily indicative of actual conditions.

As further background, it should be noted that the systems under consideration involve considerable lengths of wire or rail, or both, by which DC power is supplied to electric cars. The system can be a trolley system in which power is supplied on an overhead cable with one or more rails being used as the return conductor, or it can be a third rail system in which DC power is supplied on an insulated rail and one or both of the running rails are used as the returns. A fourth rail is also used in some systems as the return.

In any of these, there can easily be two miles or so of conductor between the measuring location and the next substation. Also, there may be a car along the section of interest with its motors connected to the line as well as lights and other accessory equipment. This circuit thus represents a resistive value and also displays considerable inductance, commonly on the order of 15 to 20 millihenrys. If the circuit is in good condition, i.e. if there are no "crowbar" shorts along the line, the breaker can be reclosed and this dead load can be picked up without difficulty, the deadload commonly being in the order of 100-500 amps. It is, however, essential to rule out the possibility of a serious fault before reclosing which requires rapid and reliable measurement of the DC resistance of the circuit without any effect from the circuit inductance.

A problem of somewhat similar magnitude but in a different context arises in connection with the measurement of the DC resistance of a very large distribution transformer winding. The normal way of making such a measurement is to apply a voltage to the transformer with some form of ohmmeter attached and wait until the inductive effect has subsided, the measured impedance at that time being, in theory, the DC resistance. One problem with that technique is that it takes a very long time to make the measurement because the inductance values are so large. A further problem is that the meter reading approaches the DC value asymptotically and it is quite difficult to determine when the correct reading has been reached. Similar problems arise in other large and distributed-inductance systems.

SUMMARY OF THE INVENTION

Accordingly, an object of the present invention is to provide a method of quickly measuring the resistive component of a load having an inductive impedance.

A further object is to provide an apparatus connectible to a circuit having an inductive impedance load for measuring the real, or resistive, component of that impedance.

Briefly described, the invention includes a method of determining the resistance of a complex impedance load having a resistive component and an inductive component including the steps of connecting a low resistance inductor in parallel circuit relationship with the load, applying an energy pulse concurrently to the load and the inductor which causes a pulse of current through the load and inductor, monitoring the instantaneous values of voltage across the inductor, determining instantaneous values of voltage across the load and current through the load and the inductor when the voltage across the inductor passes through zero, and finding the ratio of the load voltage and current at that zero point as a measure of load resistance.

In another aspect, the invention comprises an apparatus for determining the resistance of a complex impedance load having a resistance component and an inductive component comprising the combination of a low resistance inductor connected in series circuit relationship with the load and means for applying a single energy pulse to both the load and the inductor causing a pulse of current through the load and inductor. A first means for sampling instantaneous values of voltage is connected to sense the voltage across the load and a second means for sampling instantaneous values of current flowing through the load and the inductor is connected in the circuit. A means for sensing values of the voltage across the inductor produces a control signal when the instantaneous value of the inductor voltage passes through zero, and the first and second means for sampling are responsive to that control signal to sample the load voltage and current for producing and displaying the ratio of the voltage to the current which is equal to the resistance value of the load.

BRIEF DESCRIPTION OF THE DRAWINGS

In order to impart full understanding of the manner in which these and other objects are attained in accordance with the invention, a particularly advantageous embodiment thereof will be described with reference to the accompanying drawings, which form a part of this specification, and wherein.

DESCRIPTION OF THE PREFERRED EMBODIMENT

Figure 1:
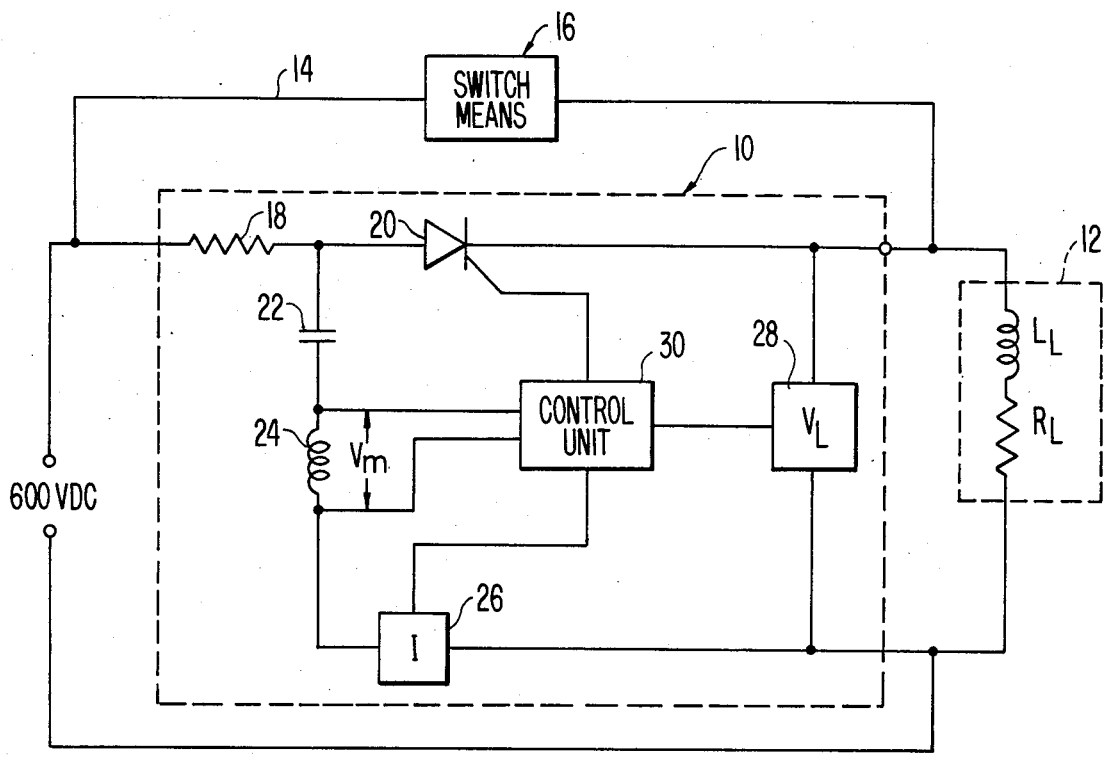
FIG. 1 is a schematic circuit diagram of an apparatus in accordance with the invention.

FIG. 1 illustrates in a schematic, equivalent circuit form a DC power source providing 600 volts DC connected to a load 12 through a circuit indicated generally at 10 which is in accordance with the present invention. The load can be any one of a variety of electrical systems, such as a transit system or distribution transformer and is characterized by having a resistive component illustrated as the lumped resistance $R_L$ and a similarly represented inductance $L_L$. In the actual load system these values would, of course, not be lumped in the manner shown but would be distributed as will be clearly understood by those skilled in this art.

It should be understood that circuit 10 is used only for test purposes as will be described herein and is normally bypassed, during operation of the system, by conductor 14 and switch means indicated generally at 16 which may be circuit-breakers or the like. Thus, the components of circuit 10 need not be capable of carrying full operating current for the system and, in fact, circuit 10 can be constructed so as to be temporarily connectible to the system for test purposes only.

As illustrated, circuit 10 includes a series charging resistor 18 connected in the hot wire of the power circuit. The current source could alternatively be a test voltage source. The value of resistor 18 is relatively high but that value does not enter into the measurement process. The switchable path of a silicon controlled rectifier 20 or other switching device is connected in series with a capacitor 22, an inductor 24 and load 12 to control the delivery of current from source capacitor 22, functioning as a current source to the load. Capacitor 22 and inductor 24 are connected in series circuit relationship with each other between the hot and return lines of the DC load. A current sensing device 26, to be further described, is connected in series in the return line between the load and the junction of inductor 24. A voltage sensing device 28 is connected across the load and across the output of circuit 10 to sense the instantaneous load voltage.

A control unit 30 is connected to the gate electrode of SCR 20 and is also connected to send trigger signals and receive inputs from current and voltage sensing devices 26 and 28 and is connected across inductor 24 to be responsive to the voltage across that inductor.

Current and voltage sensing devices 26 and 28 are sampling devices capable of sampling and holding instantaneous values of current and voltage, such devices being rather conventional at the present time. The sampling devices can be operated to repetitively sample and store values or, alternatively, they can be operated to sample upon command.

SCR 20 is illustrated as one example of a triggering device which can be used in the circuit although a variety of other solid state or electromechanical switching devices could be employed. Inductor 24 is selected to be a relatively low-resistance inductor having an inductance value which is chosen on the basis of the estimated inductance value of the load 12. Generally speaking, the inductor $L_L$ is an unknown quantity and it is not necessary to determine the magnitude of that inductance with any degree of accuracy. It has been found, however, that the present circuit operates most effectively and with good resolution when the inductance value of inductor 24 is about 1/10 the value of inductance $L_L$ or greater. In other words, it has been determined experimentally that one can measure the resistance of a load having an inductance $L_L$ which is as much as ten times greater than inductance 24 with good resolution. However, if $L_L$ is much greater than inductor 24, on the order of 1,000 times greater, the measurement is not extremely accurate but may be usable for some purposes not requiring high accuracy.

Control unit 30 can take any configuration which is capable of supplying an initiating trigger to SCR 20 and sample and hold devices receiving the measurement data. Unit 30 can also be employed to calculate the ratio of voltage to current which is used to determine the resistance value. Capacitor 22 is also chosen as a function of the size of the components to be measured. In a typical system in which the load inductance is in the order of 2,000 millihenries, inductor 24 is about 200 millihenries and capacitor 22 is a 100 microfarad electrolytic capacitor. The resistance being measured under these circumstances is commonly in the range of from less than 0.1 ohms to about 0.75 ohms.

Figure 2:
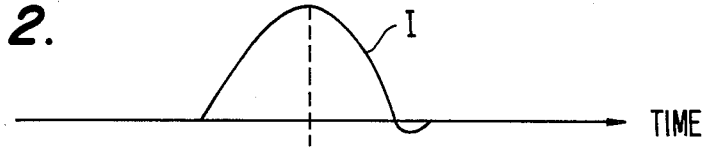
FIGS. 2, 3, and 4 are waveform diagrams illustrating current, voltage, and timing events within the circuit of FIG. 1.
Figure 3:
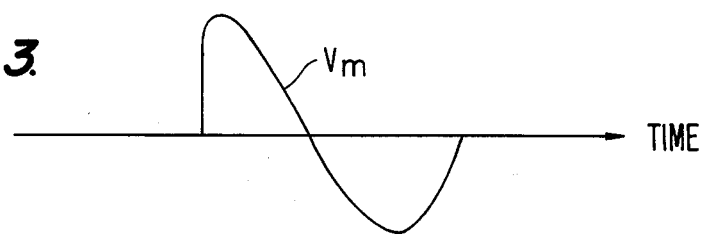

In operation, the 600 volt supply is connected to the circuit as shown and capacitor 22 is allowed to accumulate a charge. The 600 volt DC source could then be disconnected and a trigger signal supplied to SCR 20, causing a single pulse from the discharging capacitor to pass through the circuit including the SCR, load 12, current sensing device 26, and inductor 24. While the particular shape of this pulse is not critical, a typical current pulse I can appear as illustrated in FIG. 2. The primary significance of this current pulse is that it reaches a maximum and then declines. As illustrated in FIG. 3, the voltage across inductor 24 climbs rapidly upon application of the pulse and then decreases, passes through zero and increases negatively. The voltage across the inductor passes through zero when the rate of change of current with respect to time is zero, i.e., at the peak of the current waveform, and at that instant the ratio of load voltage to load current represents the value of the load resistance independent of the load inductance.

Voltage $V_M$ across inductor 24 is being continuously monitored by control unit 30 from the time of SCR firing. When that value reaches zero, the load current and voltage are sampled by devices 26 and 28 and either recorded so that the resistance value can be calculated or the ratio is taken and displayed as a measure of the load resistance. The system can be provided with suitable switching, timing and counting devices to allow automatic repetition of the measurements by generating a plurality of pulses. The results of each such measurement can then be averaged to provide a single result.

Figure 5:
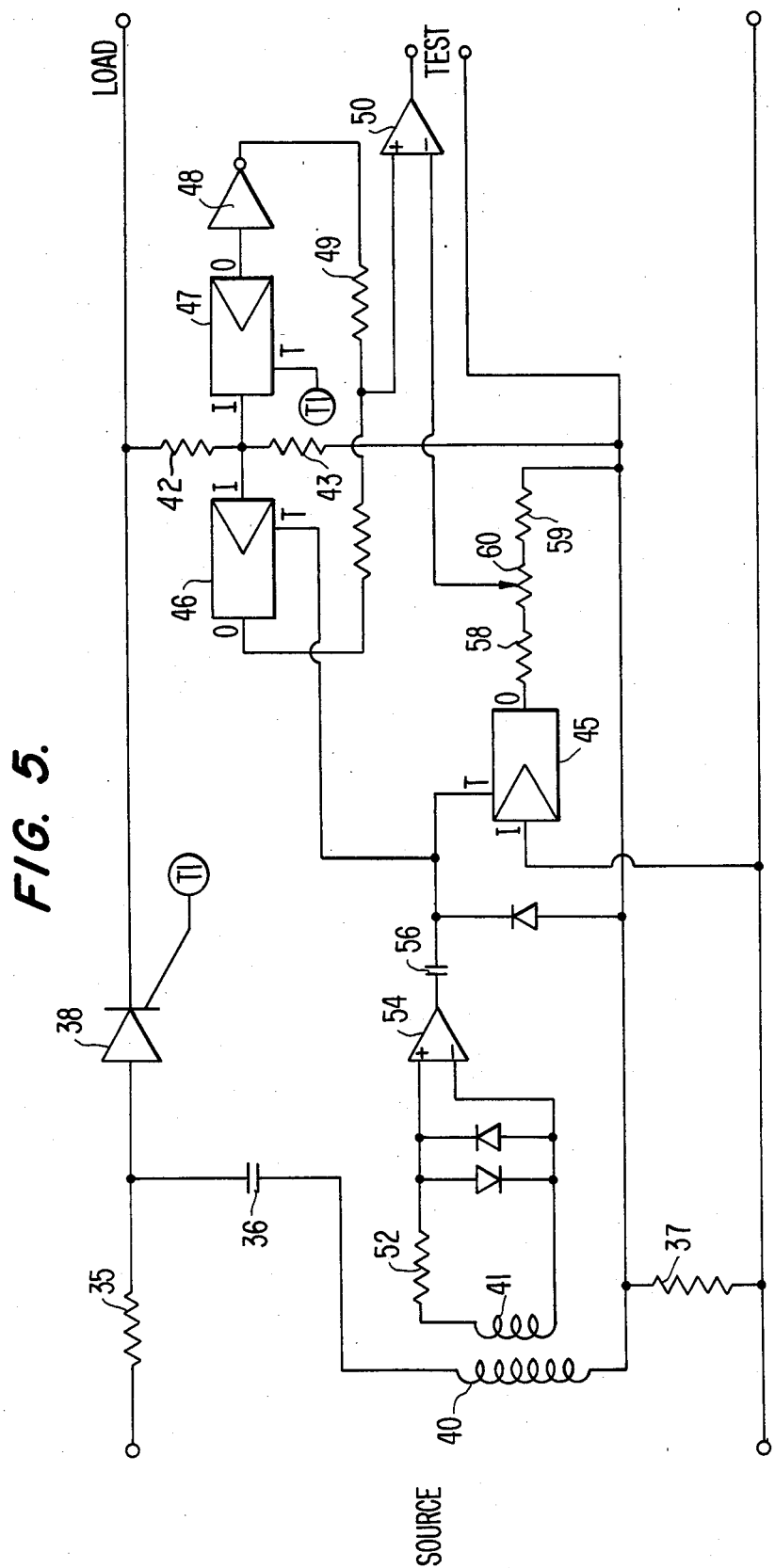
FIG. 5 is a schematic circuit diagram of a further embodiment of a measuring apparatus in accordance with the invention.

A more detailed arrangement in accordance with the invention is shown in FIG. 5. Charging current from the power source through resistor 35 charges capacitor 36. When an initiating pulse T1 is supplied to the gate electrode of SCR 38, a pulse resulting from the discharge of capacitor 36 is supplied to the load and through inductor 40, the load current being returned through a 1 ohm resistor 37 connected between inductor 40 and the common line. Voltage is also applied to a voltage divider circuit including resistors 42 and 43. The arrangement of FIG. 5 includes three sample and hold (S/H) circuits 45, 46 and 47, each of which has a voltage input terminal I, an output terminal O and a trigger input terminal T. Each of these circuits operates to retain the voltage at its input I when its trigger input terminal T is driven positive, and that input voltage level then appears at the output O. When trigger pulse T1 is applied to the gate of SCR 38, it is also applied to the T input of S/H circuit 47 which samples and holds at its output any bias voltage which may exist at the beginning of the measurement cycle at the junction between divider resistors 42 and 43. That output is applied through an inverter 48 and a resistor 49 to the non-inverting input of an operational amplifier 50.

A secondary winding 41 is magnetically coupled to winding 40 and produces a signal in response to the current in winding 40. The ends of winding 41 are connected through a 10K ohm resistor 52 to the inputs of an operational amplifier 54. The output of amplifier 54 is coupled through a capacitor 56 to the trigger inputs of S/H circuits 45 and 46. The I terminal of S/H circuit 45 is connected to the common line and its O terminal is connected through a resistor divided circuit including fixed resistors 58 and 59 and a potentiometer 60. The movable contact of potentiometer 60 is connected to the inverting input of amplifier 60.

S/H circuit 45 is across the 1 ohm resistor 37. Resistor 58,59 and 60 thus set the ratio of voltage to current, i.e., the resistance, for pickup and the output at potentiometer 60 is proportional to load current. The I input of circuit 46 is also connected to the junction between resistors 42 and 43 and its O terminal is connected through a resistor 62 to the monitoring input of amplifier 50. The values of divider resistors 42 and 43 are selected to set a desired scale factor for the voltage.

The measurement pulse is initiated, as mentioned above, by a pulse T1 simultaneously applied to the gate of SCR 38 and the T input of S/H circuit 47 which holds the bias voltage at the divider output. When the voltage across inductor 40 passes through zero, the output of amplifier 54 triggers the T inputs of S/H circuits 46 and 45 which supply levels representative of voltage and current, respectively, to amplifier 50, the bais voltage having been subtracted by the output of S/H circuit 47. S/H circuit 47 can be omitted for most transformer measurements and the ratio of outputs from circuits 46 to circuit 45 can be displayed as a resistance value.

As previously indicated, this system is particularly useful in measuring the resistance of a distributed value system, but is also useful for devices such as large inductance distribution transformers, the winding resistance values of which are difficult to measure. The ratio of such a transformer can be compared with a predetermined ratio as a "go-no go" test.

Figure 4:

The basic system described herein can be used in conjunction with a voltage measuring system including voltage compensation for preexisting positive or negative bias voltages. The measurement can be repeated a selected number of times at a known repetition frequency to evaluate potentially changing load conditions. Also, one can make a secondary measurement of time between initiation and current peak as an indication of the distance to the fault. This interval is shown at t in FIG. 4.

While one advantageous embodiment has been chosen to illustrate the invention, it will be understood by those skilled in the art that various changes and modifications can be made therein without departing from the scope of the invention as defined in the appended claims.

What is claimed is:

1. A method of determining the resistance of a complex impedance load having a resistive component and an inductive component and an inductive component including the steps of:
    connecting a low resistance inductor in series circuit relationship with the load;
    applying an energy pulse concurrently to the load and the inductor causing a pulse of current through the load and the inductor;
    monitoring the instantaneous values of voltage across the inductor;
    determining the instantaneous values of voltage across the load and current through the load and the inductor when the voltage across the inductor passes through zero; and
    finding the ratio of the instantaneous load voltage to load current at that zero point as a measure of load resistance.

2. A method according to claim 1 wherein a selected number of said energy pulses are sequentially applied.

3. A method according to claim 1 wherein the value of the inductor reactance is greater than about one tenth the inductive reactance of the load.

4. An apparatus for determining the resistance of a complex impedance load having a resistance component and an inductive component comprising the combination of:
    a low resistance inductor connected in series circuit relationship with said load;
    means for applying an energy pulse to said load and said inductor which causes a pulse of current through said load and said inductor;
    first means for sampling instantaneous values of voltage across said load;
    second means for sampling instantaneous values of current flowing through said load and said inductor; and
    means for sensing values of voltage across said inductor and for producing a control signal when the instantaneous value of said inductor voltage passes through zero;
    said first and second means for sampling being responsive to said control signal to sample said load voltage and said current and for producing and displaying the ratio thereof as the resistance value of said load.

5. An apparatus according to claim 4 wherein said means for applying an energy pulse includes means for applying a preselected number of said pulses to said load and said inductor.

* * * * *